(12) United States Patent
Sui et al.

(10) Patent No.: US 11,776,971 B2
(45) Date of Patent: Oct. 3, 2023

(54) ARRAY SUBSTRATE, MANUFACTURING METHOD THEREOF AND DISPLAY APPARATUS

(71) Applicant: BOE TECHNOLOGY GROUP CO., LTD., Beijing (CN)

(72) Inventors: Kai Sui, Beijing (CN); Jinxiang Xue, Beijing (CN); Zhongyuan Sun, Beijing (CN); Chao Dong, Beijing (CN); Xiaofen Wang, Beijing (CN); Qian Jin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 258 days.

(21) Appl. No.: 17/059,231

(22) PCT Filed: Mar. 26, 2020

(86) PCT No.: PCT/CN2020/081361
§ 371 (c)(1),
(2) Date: Nov. 26, 2020

(87) PCT Pub. No.: WO2020/192725
PCT Pub. Date: Oct. 1, 2020

(65) Prior Publication Data
US 2021/0210523 A1    Jul. 8, 2021

(30) Foreign Application Priority Data
Mar. 27, 2019   (CN) .......................... 201910239616.7

(51) Int. Cl.
*H01L 27/12* (2006.01)

(52) U.S. Cl.
CPC ...... *H01L 27/1244* (2013.01); *H01L 27/1262* (2013.01)

(58) Field of Classification Search
CPC ............. H01L 27/1244; H01L 27/1262; H01L 27/124; H01L 27/1218; H01L 27/32; G09F 9/30
See application file for complete search history.

(56) References Cited

U.S. PATENT DOCUMENTS

| 2010/0233843 A1 | 9/2010 | Frolov et al. |
| 2015/0069617 A1 | 3/2015 | Arora et al. |

(Continued)

FOREIGN PATENT DOCUMENTS

| CN | 105324841 A | 2/2016 |
| CN | 107731866 A | 2/2018 |

(Continued)

OTHER PUBLICATIONS

China Patent Office, First Office Action dated Sep. 1, 2020, for corresponding Chinese application 201910239616.7.

*Primary Examiner* — Sitaramarao S Yechuri
(74) *Attorney, Agent, or Firm* — HOUTTEMAN LAW LLC (57) ABSTRACT

The present disclosure provides an array substrate, a method for manufacturing the array substrate, and a display apparatus. The array substrate includes a plurality of substrates spaced apart from each other; a plurality of display units which are provided on the plurality of substrates, respectively; a plurality of connection lines each of which is configured to connect two adjacent display units; a plurality of stretchable connection bridges each of which is configured to connect two adjacent substrates of the plurality of substrates; and a length of the connection line is greater than a length of the stretchable connection bridge.

19 Claims, 6 Drawing Sheets

(56) References Cited

U.S. PATENT DOCUMENTS

| | | | |
|---|---|---|---|
| 2017/0025550 A1* | 1/2017 | Jung | H01L 29/872 |
| 2017/0033273 A1* | 2/2017 | Chang | H01L 39/223 |
| 2017/0365557 A1 | 12/2017 | Rogers et al. | |
| 2018/0046221 A1 | 2/2018 | Choi et al. | |
| 2018/0052493 A1 | 2/2018 | Hong et al. | |
| 2018/0090699 A1 | 3/2018 | Shin et al. | |
| 2018/0114825 A1 | 4/2018 | Hong et al. | |
| 2019/0107911 A1 | 4/2019 | Zhai et al. | |
| 2020/0111390 A1* | 4/2020 | Kim | G09F 9/301 |
| 2021/0083142 A1* | 3/2021 | Lee | H01L 33/005 |

FOREIGN PATENT DOCUMENTS

| | | |
|---|---|---|
| CN | 107871761 A | 4/2018 |
| CN | 107994052 A | 5/2018 |
| CN | 108269501 A | 7/2018 |
| CN | 108766951 A | 11/2018 |
| CN | 108831309 A | 11/2018 |
| CN | 109064900 A | 12/2018 |
| CN | 109189265 A | 1/2019 |
| CN | 109346504 A | 2/2019 |
| CN | 109920334 A | 6/2019 |

* cited by examiner

ARRAY SUBSTRATE, MANUFACTURING METHOD THEREOF AND DISPLAY APPARATUS

CROSS REFERENCE TO RELATED APPLICATIONS

The present application claims the priority of the Chinese Patent Application with the Application No. 201910239616.7 filed Mar. 27, 2019, which is incorporated herein in entirety by reference.

TECHNICAL FIELD

The present disclosure relates to the field of display technology, in particular to an array substrate, a method for manufacturing an array substrate, and a display apparatus.

BACKGROUND

During the 2017 U.S. Display week (SID 2017) held in the Los Angeles Convention Center in May 23 to May 25, the Samsung Display shows a 9.1 inch stretchable AMOLED (Active-matrix organic light emitting diode) prototype. When this display screen displays, the display screen may be stretched to 12 mm while maintaining a high resolution. The cool stretchable display attracts countless eyes, subverts a traditional display concept, and contains many technological contents.

SUMMARY

According to an aspect of the present disclosure, an array substrate is provided to include a plurality of substrates spaced apart from each other; a plurality of display units provided on the plurality of substrates, respectively; a plurality of connection lines, each of which is configured to connect two adjacent display units of the plurality of display units; and a plurality of stretchable connection bridges, each of which is configured to connect two adjacent substrates of the plurality of substrates, wherein a length of each connection line is greater than a length of each stretchable connection bridge.

In some embodiments, the array substrate further includes hollow-out regions which are between the plurality of display units by the connection lines and the stretchable connection bridges.

In some embodiments, two adjacent substrates of the plurality of substrates are connected by at least one of the plurality of stretchable connection bridges.

In some embodiments, the stretchable connection bridge has a length greater than or equal to a distance between two adjacent substrates.

In some embodiments, straight lines formed by connecting connection points of the stretchable connection bridge between the two corresponding adjacent substrates on the two adjacent substrates are parallel to straight lines formed by connecting connection points of the connection line between the two display units on the two adjacent substrates on the two display units.

In some embodiment, a cross-sectional area of the connection line gradually increases as the connection line approaches the display unit, and a cross-sectional area of the stretchable connection bridge gradually increases as the stretchable connection bridge approaches the substrate.

In some embodiments, a Young's modulus of each of the plurality of substrates is greater than a Young's modulus of the stretchable connection bridge.

In some embodiments, the connection line includes a first straight line portion, a first arc portion, a second straight line portion, a second arc portion, and a third straight line portion that are sequentially connected.

In some embodiments, the connection line includes a conductive material.

In some embodiments, the conductive material includes at least one of molybdenum, silver, copper, aluminum, magnesium, neodymium, indium tin oxide, indium gallium zinc oxide, indium zinc oxide.

In some embodiment, a material of the stretchable connection bridge includes any one of polydimethylsiloxane, polyethylene naphthalate, polyimide, polyetherimide, polyethylene terephthalate, and polyphenylene sulfide.

In some embodiments, the array substrate further includes each of an optically clear adhesive, an acryl-based adhesive, a silicon-based adhesive, a polyurethane-based adhesive configured to adhere each of the plurality of substrates to the display unit provided on the substrate.

In some embodiment, each of the plurality of substrates has a shape of any of a square, an oval, a circle, a rectangle, a parallelogram, and a hexagon.

In some embodiments, the array substrate further includes a film package layer on a side of the plurality of display units distal to the plurality of substrates.

According to an aspect of the present disclosure, the present disclosure provides a display apparatus, which includes the above array substrate and an integrated circuit connected to the array substrate.

According to an aspect of the present disclosure, the present disclosure provides a method for manufacturing an array substrate, including: forming a plurality of substrates spaced apart from each other and a plurality of stretchable connection bridges each of which is configured to connect two adjacent substrates of the plurality of substrates; forming a plurality of display units spaced apart from each other and a plurality of connection lines each of which is configured to connect two adjacent display units of the plurality of display units, wherein a length of the connection line is greater than a length of the stretchable connection bridge; and aligning and assembling the plurality of substrates spaced apart from each other and the plurality of display units spaced apart from each other in a one-to-one correspondence manner by a transferring process.

In some embodiment, the forming a plurality of substrates spaced apart from each other and a plurality of stretchable connection bridges each of which is configured to connect two adjacent substrates of the plurality of substrates includes performing an etching process or a laser cutting process on a flexible film to form the plurality of substrates arranged in an array and the plurality of stretchable connection bridges each of which is configured to connect two adjacent substrates of the plurality of substrates.

In some embodiment, the forming a plurality of substrates spaced apart from each other and a plurality of stretchable connection bridges each of which is configured to connect two adjacent substrates of the plurality of substrates further includes performing a heating process or a laser process on the plurality of substrates.

In some embodiment, the forming a plurality of display units and a plurality of connection lines each of which is configured to connect two adjacent display units of the plurality of display units includes: forming the plurality of display units spaced apart from each other and the plurality of connection lines each of which is configured to connect two adjacent display units of the plurality of display units on a substrate such that the substrate with the plurality of display units and the plurality of connection lines includes a display unit region and a non-display unit region; and cutting off a part of the non-display unit region other than the plurality of connecting lines by an etching process or a laser cutting process.

In some embodiments, the aligning and assembling the plurality of substrates spaced apart from each other and the plurality of display units spaced apart from each other in a one-to-one correspondence manner by a transferring process includes adhering the plurality of substrates to the plurality of display units in a one-to-one correspondence manner.

DETAIL DESCRIPTION OF EMBODIMENTS

The present disclosure will be described in further detail with reference to the drawings and detailed description, so that objects, features and advantages of the present disclosure may be more clearly understood.

In a stretchable display apparatus, there are two selections for patterning design and material of a connection line for a TFT (Thin Film Transistor). One is that the connection line of the TFT adopts a connection line of metal. The connection line of metal has rigidity, and cannot be stretched by itself. When being patterned, the connection line of metal may release stress during the patterning process, to achieve a certain stretching effect. The other is that the connection line for the TFT adopts a connection line of conductive rubber. The conductive rubber is formed by doping silver nanowires or other metal conductive particles in rubber. The connection line of conductive rubber has stretching capacity, but a preparation process for the conductive rubber is immature and is in a research and development stage at present.

The inventors have found that when the stretchable display apparatus is stretched for a long period of time, a connection portion thereof is easily broken at a stress concentration point by adopting the connection line of metal. The connection line of metal has large stress, and geometric deformation may occur after the connection line of metal is stretched for multiple times, thus the connection line is difficult to be completely reset after being stretched for multiple times. Further, a phase shift occurs between adjacent display units (island regions), and a certain display unit or some of the display units cannot be completely reset. Because a certain display unit or some of the display units cannot be completely reset, an angle between the display unit which cannot be reset and an adjacent display unit is shifted, so that a phase between the two adjacent display units is shifted, and thus a display effect is adversely influenced, and even pictures are distorted.

In order to at least solve the above problems in the stretchable display apparatus that the connection line of metal is difficult to be completely reset after being stretched for multiple times by adopting the connection line of metal, a phase shift occurs between adjacent display units and thus a display effect is adversely influenced, and even pictures are distorted, some embodiments of the present disclosure provide an array substrate.

Figure 1:
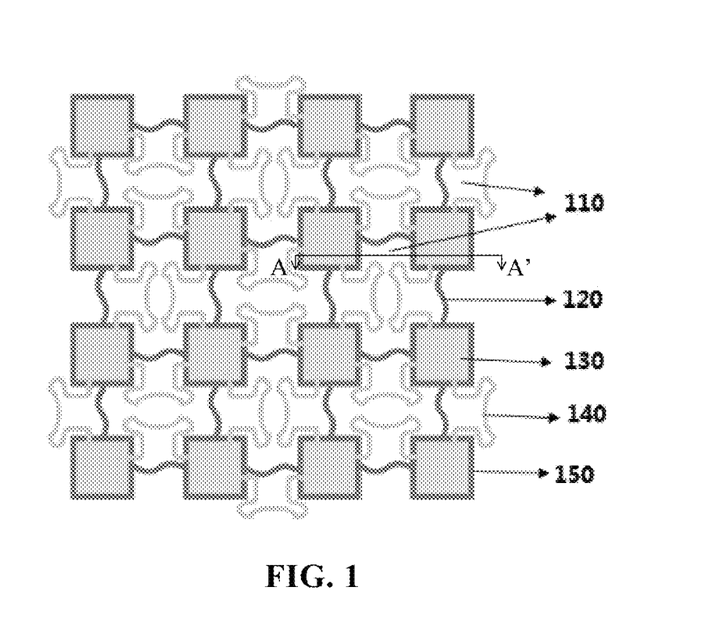
FIG. 1 illustrates a schematic structural diagram of an array substrate provided in accordance with an embodiment of the present disclosure.

As shown in FIG. 1, the array substrate may include: a plurality of substrates 150 spaced apart from each other, for example, the plurality of substrates 150 may be arranged in an array; a plurality of display units 130 respectively provided on the plurality of substrates 150; a plurality of connection lines 140, each of which is configured to connect two adjacent display units 130 of the plurality of display units 130; a plurality of stretchable connection bridges 120, each of which is configured to connect two adjacent substrates 150 of the plurality of substrates 150. A length of the connection line 140 is greater than a length of the stretchable connection bridge 120. Because the length of the connection line 140 is greater than that of the stretchable connection bridge 120, when the substrate 150 is stretched for a long period of time, the stretchable connection bridge 120 may reduce the deformation of the connection line 140, thereby preventing the phase shift between adjacent display units from occurring, and ensuring that a display picture is clear and undistorted after the display apparatus is stretched for a long time.

In the embodiment of the present disclosure, with the above connection structure, hollow-out regions 110 are formed between the plurality of display units by the connection lines and the stretchable connection bridges. The hollow-out regions 110 may be formed by an etching process or by an etching process together with a laser cutting process, which will be described in detail in the following manufacturing method, and will not be described redundantly.

Figure 2:
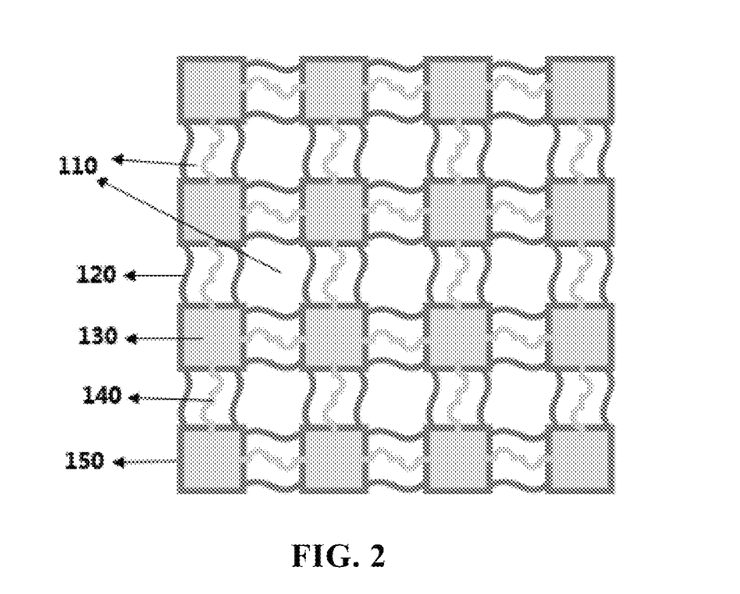
FIG. 2 illustrates a schematic structural diagram of an array substrate provided in accordance with an embodiment of the present disclosure.

In one embodiment of the present disclosure, two adjacent substrates 150 of the plurality of substrates 150 may be connected by at least one stretchable connection bridge 120 (as shown in FIGS. 1 and 2). When two adjacent substrates 150 are connected by one stretchable connection bridge 120 (as shown in FIG. 1), the connection line 140 may be formed of a special pattern, so that the connection line 140 may have a larger stretching amount. A particular force analysis for the connection line 140 when a stretching force is applied on the connection line 140 may be seen in FIG. 3.

Figure 3:
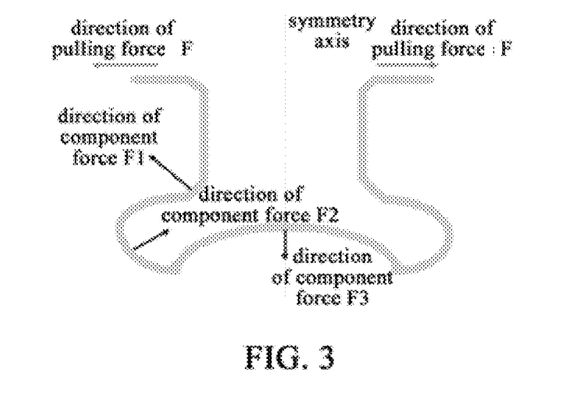
FIG. 3 illustrates a schematic diagram of a force analysis for a connection line provided in accordance with an embodiment of the present disclosure.

Referring to FIG. 3, a schematic diagram of a force analysis for a connection line provided in accordance with an embodiment of the present disclosure is shown. As shown in FIG. 3, after two ends of the connection line 140 are subjected to pulling forces F, three component forces F1, F2, and F3 are respectively generated, and all of the three component forces point towards respective curvature centers along respective curvature radius direction at respective curved portions, so that the curved portions tend to be flat, and a stretching capability of the connection line 140 is further improved.

Figure 4:
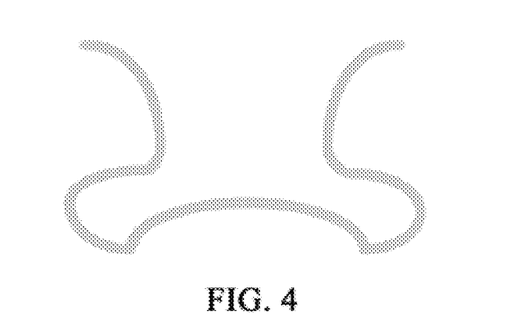
FIG. 4 illustrates a schematic structural diagram of a connection line provided in accordance with an embodiment of the present disclosure.

Of course, in a specific implementation, a structure of the connection line 140 may be set according to an actual situation. For example, referring to FIG. 4, a schematic diagram of a structure of a connection line 140 provided in the embodiment of the present disclosure is shown, and the connection line may also be a connection line having a shape as shown in FIG. 4, or the like. In particular, a shape of the connection line may be set according to an actual situation, which is not limited in the embodiment of the present disclosure.

In another embodiment of the present disclosure, two adjacent substrates 150 may be connected by two stretchable connection bridges 120. For example, referring to FIG. 2, a schematic structural diagram of an array substrate provided in an embodiment of the present disclosure is shown. As shown in FIG. 2, two adjacent substrates 150 are connected by two stretchable connection bridges 120.

Figure 5:
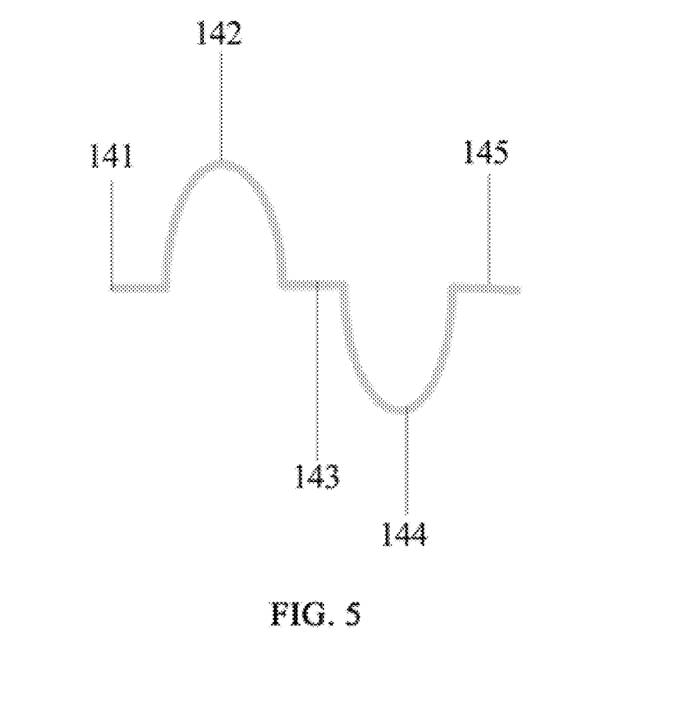
FIG. 5 illustrates a schematic structural diagram of a connection line provided in accordance with an embodiment of the present disclosure.

Referring to FIG. 5, a schematic structural diagram of a connection line provided by an embodiment of the present disclosure is shown. As shown in FIG. 5, when two adjacent substrates 150 are connected by two stretchable connection bridges 120, the connection line 140 may include a first straight line portion 141, a first arc portion 142, a second straight line portion 143, a second arc portion 144, and a third straight line portion 145 that are sequentially connected, and this structure may enable the connection line 140 to have a good stretching effect and may ensure that the phase shift between two adjacent display units does not occurs.

Figure 6:
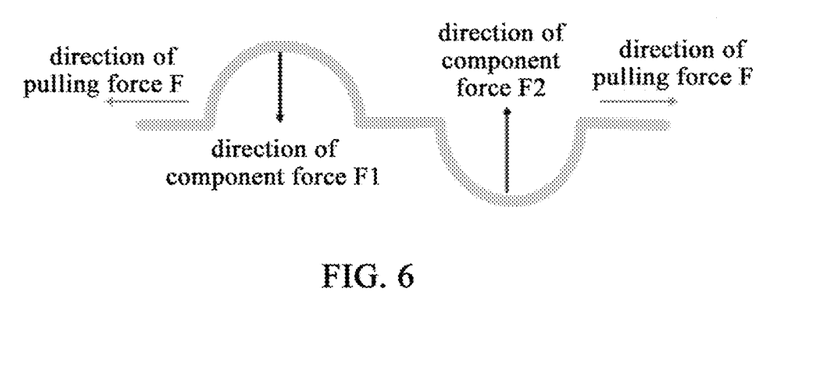
FIG. 6 illustrates a schematic diagram of a force analysis for a connection line provided in accordance with an embodiment of the present disclosure.

Of course, the structure of the connection line shown in FIG. 6 may be adopted to replace the structure shown in FIG. 5, for the structure of the connection line 140. In a specific implementation, the structure of the connection line 140 may be set according to an actual situation, which is not limited in the embodiment of the present disclosure.

A following analysis is performed for a force applied on the connection line 140 in conjunction with the drawings.

Referring to FIG. 6, a schematic diagram of a force analysis for a connection line provided in accordance with an embodiment of the present disclosure is shown. As shown in FIG. 6, after the connection line 140 is subjected to pulling forces F, centripetal forces F1 and F2 are respectively generated at the first arc portion 141 and the second arc portion 142, so that the stresses at the first arc portion 141 and the second arc portion 142 are released, the stretching amount is increased, and the force analysis is shown in FIG. 6.

The joint between the connection line 140 and the display unit 130 may be described as follows in FIG. 7.

Figure 7:
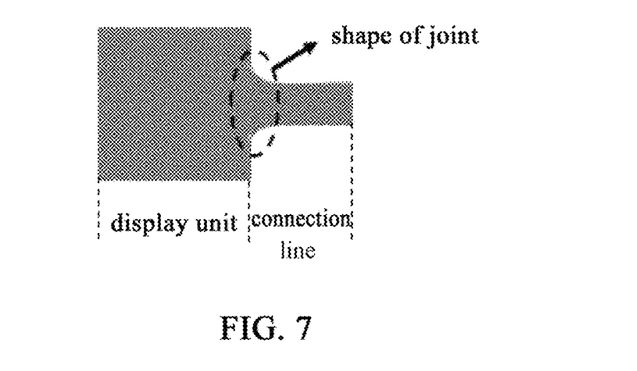
FIG. 7 illustrates a schematic diagram of a joint between a connection line and a display unit provided in accordance with an embodiment of the present disclosure.

Referring to FIG. 7, a schematic diagram of a joint between a connection line and a display unit provided in accordance with an embodiment of the present disclosure is shown. As shown in FIG. 7, a joint between the connection line 140 and the display unit 130 may be as shown in FIG. 7, that is, at the joint between the connection line and the display unit, a cross-sectional area of the connection line 140 is gradually increased as it approaches the display unit 130. That is, at the joint, the connection line may be configured to be similar to a semi-arc structure, which is advantageous for protecting the connection points. Of course, a cross-sectional area of the stretchable connection bridge 120 may be gradually increased as it approaches the substrate 150, which is advantageous for protecting the connection points between the stretchable connection bridge 120 and the substrate 150.

Of course, in a specific implementation, other connection methods may also be adopted, which is not limited by the embodiment of the present disclosure.

Figure 12:
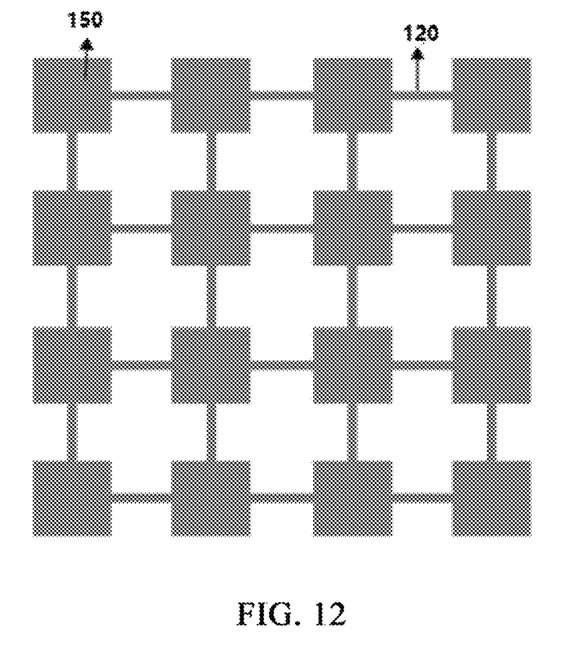
FIG. 12 illustrates a schematic diagram of substrates and stretchable connection bridges according to an embodiment of the present disclosure.
Figure 13:
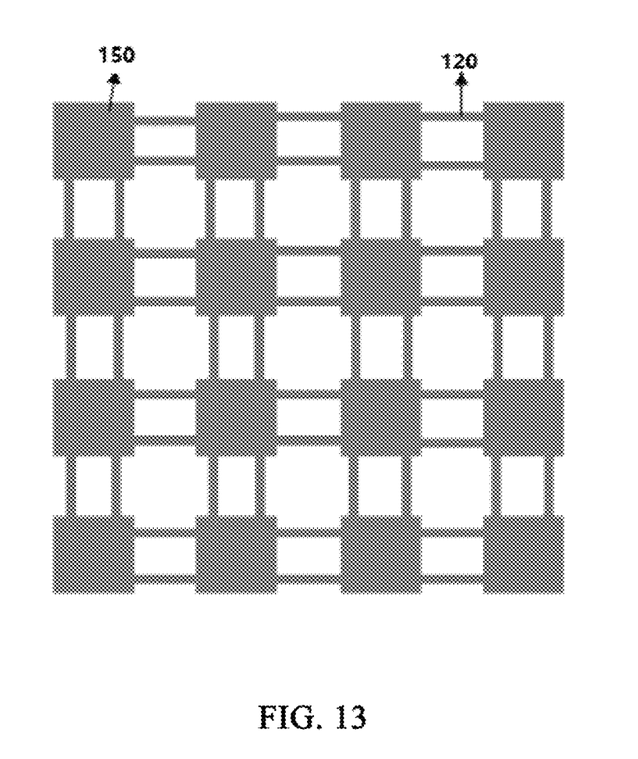
FIG. 13 illustrates a schematic diagram of substrates and stretchable connection bridges according to an embodiment of the present disclosure.

Referring to FIGS. 1 and 2, the stretchable connection bridge 120 has a length greater than a distance between two adjacent substrates 150. Referring to FIGS. 12 and 13, the length of the stretchable connection bridge 120 is equal to the distance between two adjacent substrates 150, so that the stretchable connection bridges 120 may be saved in material and the stretching force maintained by the connection lines 140 may be relieved.

Referring to FIGS. 1, 2, 12 and 13, straight lines formed by connecting connection points of the stretchable connection bridge 120 between the two adjacent substrates 150 on the two adjacent substrates 150 are parallel to straight lines formed by connecting connection points of the connection line 140 between the two display units 130 on the two adjacent substrates 150 on the two display units 130, which may ensure that the phase shift between the display units does not occur and the pictures are clear and undistorted when the display apparatus is stretched.

In one embodiment of the present disclosure, the Young's modulus of the substrate 150 is greater than that of the stretchable connection bridge 120, i.e., the amount of stretching deformation of the substrate 150 is less than that of the stretchable connection bridge 120, which may ensure that connection lines inside the display units 130 are not affected by the stretching force when the display units 130 are stretched.

In the present disclosure, the Young's modulus of the substrate 150 may be set in a range of 0.5 to 2 Gpa, the Young's modulus of the stretchable connection bridge 120 may be set in a range of 4 to 15 Gpa. The Young's moduli for the substrate 150 and the stretchable connection bridge 120 may be determined according to an actual situation. Specific values of the Young's moduli for the substrate and the stretchable connection bridge are not limited in the embodiment of the present disclosure.

In another embodiment of the present disclosure, the connection line 140 may include a conductive material.

The conductive material may include one or more of metal materials, such as molybdenum, silver, copper, aluminum, magnesium, neodymium, indium tin oxide (ITO), indium gallium zinc oxide (IGZO), and indium zinc oxide (IZO), which is not limited in the embodiment of the present disclosure.

Of course, the connection line 140 may alternatively include a plurality of wires, which may be determined according to an actual situation, and not limited in the embodiment of the present disclosure.

In another embodiment of the present disclosure, a material of the stretchable connection bridge 120 may include at least one of materials having a high elasticity, such as polydimethylsiloxane (PDMS), polyethylene naphthalate (PEN), polyimide (PI), polyetherimide (PEI), polyethylene terephthalate (PET), and polyphenylene sulfide (PPS), which is not limited in the embodiment of the present disclosure.

In an embodiment of the present disclosure, any one of an optically clear adhesive (OCA), an acryl-based adhesive, a silicon-based adhesive, a polyurethane-based adhesive, and the like may be used, for adhering any one of the plurality of substrates 150 and the corresponding display unit 130 provided on the substrate. Any one of the plurality of substrates 150 may has a shape of any one of a square, an oval, a circle, a rectangle, a parallelogram, a hexagon, and the like, which is not limited in the embodiment of the present disclosure.

In an embodiment of the present disclosure, the array substrate may further include a film package layer, and the film package layer may be mounted at a side of the display unit 130 distal to the substrate 150. In a specific implementation, the film package layer may be a discrete package structure to package one corresponding display unit 130, or an integral package structure to package all the display units 130, as shown in FIG. 8, which is determined according to an actual situation, and not limited in the embodiment of the present disclosure.

Figure 11:
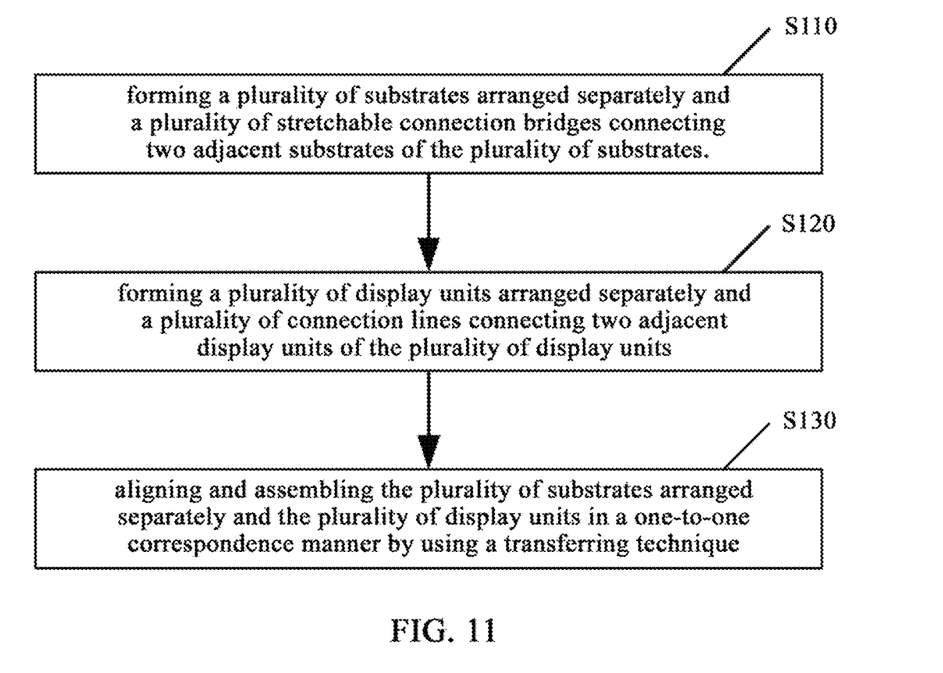
FIG. 11 illustrates a flowchart of a method for manufacturing an array substrate according to an embodiment of the present disclosure.

Next, a method for manufacturing the array substrate provided by the embodiment of the present disclosure will be described below with reference to FIG. 11. The method for manufacturing the array substrate mainly includes the following three steps. Step S110, forming a plurality of substrates spaced apart from each other, and a plurality of stretchable connection bridges connecting two adjacent substrates of the plurality of substrates. Step S120, forming a plurality of display units spaced apart from each other, and a plurality of connection lines connecting two adjacent display units of the plurality of display units, wherein a length of the connection line is greater than a length of the stretchable connection bridge. Step S130, aligning and assembling the plurality of substrates spaced apart from each other and the plurality of display units spaced apart from each other in a one-to-one correspondence manner by using a transferring technique. Step S110 and step S120 may be interchanged. In particular, a following procedure may be adopted.

1. Preparing a Display Substrate

Figure 8:
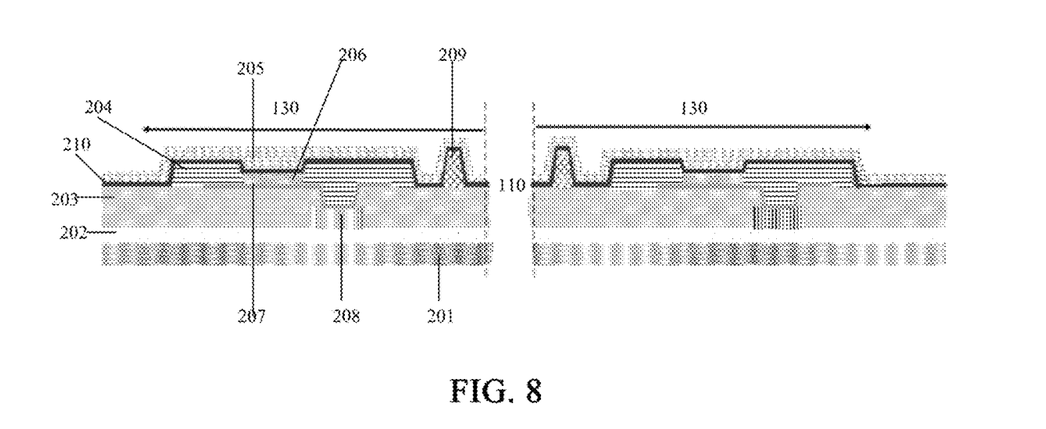
FIG. 8 illustrates a schematic diagram of an internal configuration of a display apparatus provided in accordance with an embodiment of the present disclosure.

Referring to FIG. 8, a schematic diagram of an internal configuration of a display apparatus provided in an embodiment of the present disclosure is shown. FIG. 8 is a cross-sectional view of the array substrate taken along a section line AA' shown in FIG. 1, in which the hollow-out region 110 and the display units 130 may be seen. A substrate 201 made of PI (not limited to PI, but may be selected from one of PPS, PEN, PEI, PET, PDMS) is provided; a buffer layer 202, a connection line 208 (such as a thin film transistor and a signal line), a pixel definition layer 204, a light emitting layer 206, an anode 207, a cathode 210, a package layer 205, and a peripheral dam region 209 are sequentially formed; an inorganic layer 203 is filled between the buffer layer 202 and the pixel definition layer 204, and the anode 207 and a part of the cathode 210 are located on the inorganic layer 203, thereby forming a display substrate. The display substrate is divided into a display unit region and a non-display unit region.

2. Patterning the Display Substrate by Using an Etching Process or a Laser Cutting Process The display substrate is patterned by using an etching process or a laser cutting process, to form a plurality of display units each having an island shape, a plurality of connection lines for connecting two adjacent display units of the plurality of display units, and hollow-out regions located in a part of the non-display unit region other than the connection lines. In this way, the display substrate may be divided into the display unit region where the display units are located and the non-display unit region where no display unit is provided. The plurality of connecting lines for connecting two adjacent display units of the plurality of display units are further provided between the display units. It is to be understood that, the etching process or the laser cutting process may be performed after the light emitting layer and the package layer are prepared, or before the light emitting layer and the package layer are prepared, which may be determined according to an actual situation, and is not limited in this embodiment of the present disclosure.

3. Performing an Etching Process or a Laser Cutting Process on a Flexible Film

The flexible film is processed using an etching process or a laser cutting process, to form a plurality of substrates spaced apart from each other (e.g., arranged in an array) and a plurality of stretchable connection bridges connecting two adjacent substrates of the plurality of substrates. Each of the plurality of substrates corresponds to a display unit region. Also, in order to make the amount of stretching deformation between the substrate and the stretchable connection bridge be different, the plurality of substrates may be subjected to a heating treatment or a laser treatment so that the amount of stretching deformation of the substrates is smaller than that of the stretchable connection bridges.

Figure 9:
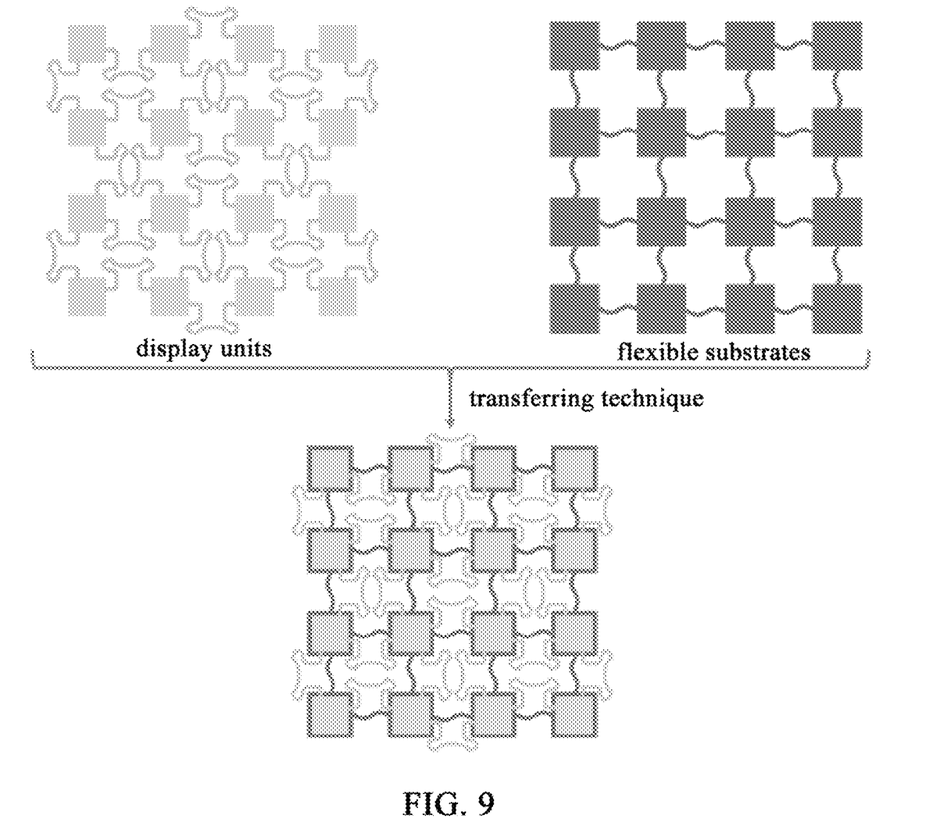
FIG. 9 illustrates a schematic diagram of an aligning and assembling process by using a transferring technique provided in accordance with an embodiment of the present disclosure.

4. Aligning and Assembling the Flexible Substrates and the Display Substrates by Using a Transferring Process Referring to FIG. 9, a schematic diagram of an aligning and assembling process by using a transferring process provided in accordance with an embodiment of the present disclosure is shown. As shown in FIG. 9, the plurality of substrates arranged in an array and the stretchable connection bridges connecting two adjacent substrates of the plurality of substrates and the patterned display substrate are aligned and assembled by using a transferring process, and bonded together by an adhesive, to form an array substrate.

A stretch simulation is performed on the array substrate, which is described below in conjunction with FIG. 10.

Figure 10:
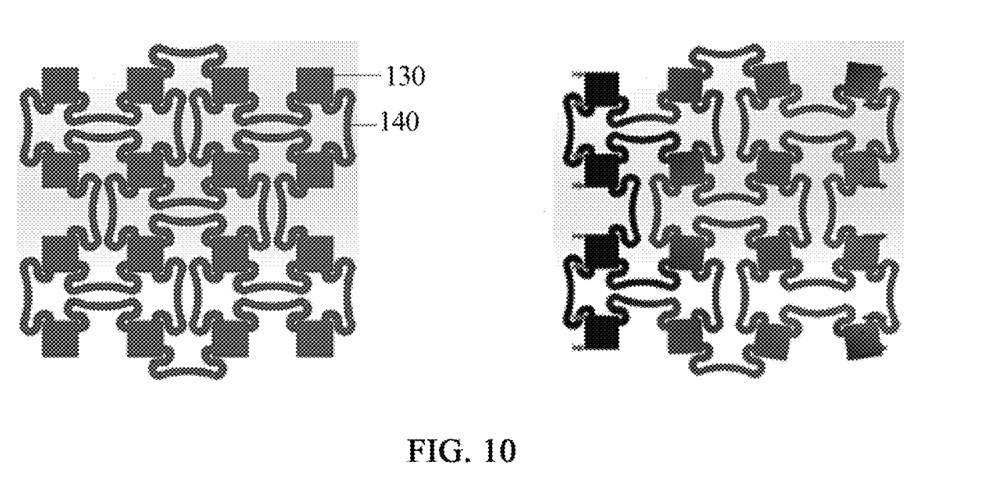
FIG. 10 illustrates a schematic diagram of a stretch simulation provided in accordance with an embodiment of the present disclosure.

Referring to FIG. 10, a schematic diagram of a stretch simulation provided by the embodiment of the present disclosure is shown.

As shown in FIG. 10, the left drawing shows the array substrate before being stretched, and the right drawing shows the array substrate after being stretched with a phase shifted.

As shown in FIG. 10, the display apparatus including the plurality of display units that are not attached to an elastic stretchable substrate may, after being stretched, distort and deflect due to connection lines, and a phase shift may occur between the display units. After the elastic stretchable substrate is provided below the display apparatus, a stress generated by the connection lines after being stretched may be shared, which ensures that the phase between the display units is not substantially shifted, and a display effect is not substantially influenced by the stretching. Simulation tests show that a stretch rate of the display apparatus may reach 6.8%, and an amount of strain is only 1.2%, so that the display apparatus shows a very excellent stretching property.

In the array substrate provided by the embodiment of the present disclosure, a plurality of substrates spaced apart from each other are provided, a display unit is formed on each substrate, a connection line is connected between two adjacent display units, to realize an electrical connection between the two adjacent display units, and a nonmetallic stretchable connection bridge is connected between two adjacent substrates. In a same direction, the stretchable connection bridge is provided side-by-side together with the connection line, and a length of the connection line is greater than a length of the stretchable connection bridge. In the embodiment of the present disclosure, the nonmetallic stretchable connection bridge is used, such that it may ensure a longer stretching life of the stretchable display apparatus, and a relative position between two display units of the display apparatus when being stretched may not be shifted, thereby ensuring clear pictures and no distortion after the display apparatus is stretched for a long time.

In an embodiment of the present disclosure, a display apparatus is further provided, which may include the array substrate of any one of the above embodiments and an integrated circuit connected to the array substrate.

What is claimed is:

1. An array substrate, comprising:
   a plurality of substrates spaced apart from each other;
   a plurality of display units provided on the plurality of substrates, respectively;
   a plurality of connection lines, each of which is configured to connect two adjacent display units of the plurality of display units; and
   a plurality of stretchable connection bridges, each of which is configured to connect two adjacent substrates of the plurality of substrates, wherein a length of each connection line is greater than a length of each stretchable connection bridge,
   wherein a cross-sectional area of the connection line gradually increases as the connection line approaches the display unit, and a cross-sectional area of the stretchable connection bridge gradually increases as the stretchable connection bridge approaches the substrate.

2. The array substrate of claim 1, further comprising hollow-out regions which are between the plurality of display units by the connection lines and the stretchable connection bridges.

3. The array substrate of claim 2, wherein two adjacent substrates of the plurality of substrates are connected by at least one of the plurality of stretchable connection bridges.

4. The array substrate of claim 3, wherein the stretchable connection bridge has a length greater than or equal to a distance between two adjacent substrates.

5. The array substrate of claim 4, wherein straight lines formed by connecting connection points of the stretchable connection bridge between the two corresponding adjacent substrates on the two adjacent substrates are parallel to straight lines formed by connecting connection points of the connection line between the two display units on the two adjacent substrates on the two display units.

6. The array substrate of claim 1, wherein a Young's modulus of each of the plurality of substrates is greater than a Young's modulus of the stretchable connection bridge.

7. The array substrate of claim 6, wherein the connection line comprises a first straight line portion, a first arc portion, a second straight line portion, a second arc portion, and a third straight line portion that are sequentially connected.

8. The array substrate of claim 7, wherein the connection line comprises a conductive material.

9. The array substrate of claim 8, wherein the conductive material comprises at least one of molybdenum, silver, copper, aluminum, magnesium, neodymium, indium tin oxide, indium gallium zinc oxide, indium zinc oxide.

10. The array substrate of claim 9, wherein a material of the stretchable connection bridge comprises any one of polydimethylsiloxane, polyethylene naphthalate, polyimide, polyetherimide, polyethylene terephthalate, and polyphenylene sulfide.

11. The array substrate of claim 10, further comprising each of an optically clear adhesive, an acryl-based adhesive, a silicon-based adhesive, a polyurethane-based adhesive configured to adhere each of the plurality of substrates to the display unit provided on the substrate.

12. The array substrate of claim 11, wherein each of the plurality of substrates has a shape of any of a square, an oval, a circle, a rectangle, a parallelogram, and a hexagon.

13. The array substrate of claim 12, further comprising a film package layer on a side of the plurality of display units distal to the plurality of substrates.

14. A display apparatus, comprising the array substrate of claim 1 and an integrated circuit connected to the array substrate.

15. A method for manufacturing an array substrate, comprising:
   forming a plurality of substrates spaced apart from each other and a plurality of stretchable connection bridges each of which is configured to connect two adjacent substrates of the plurality of substrates;
   forming a plurality of display units spaced apart from each other and a plurality of connection lines each of which is configured to connect two adjacent display units of the plurality of display units, wherein a length of the connection line is greater than a length of the stretchable connection bridge; and
   aligning and assembling the plurality of substrates spaced apart from each other and the plurality of display units spaced apart from each other in a one-to-one correspondence manner by a transferring process,
   wherein a cross-sectional area of the connection line gradually increases as the connection line approaches the display unit, and a cross-sectional area of the stretchable connection bridge gradually increases as the stretchable connection bridge approaches the substrate.

16. The method of claim 15, wherein the forming a plurality of substrates spaced apart from each other and a plurality of stretchable connection bridges each of which is configured to connect two adjacent substrates of the plurality of substrates comprises performing an etching process or a laser cutting process on a flexible film to form the plurality of substrates arranged in an array and the plurality of stretchable connection bridges each of which is configured to connect two adjacent substrates of the plurality of substrates.

17. The method of claim 16, wherein the forming a plurality of substrates spaced apart from each other and a plurality of stretchable connection bridges each of which is configured to connect two adjacent substrates of the plurality of substrates further comprises performing a heating process or a laser process on the plurality of substrates.

18. The method of claim 15, wherein the forming a plurality of display units and a plurality of connection lines each of which is configured to connect two adjacent display units of the plurality of display units comprises:

forming the plurality of display units spaced apart from each other and the plurality of connection lines each of which is configured to connect two adjacent display units of the plurality of display units on a substrate such that the substrate with the plurality of display units and the plurality of connection lines comprises a display unit region and a non-display unit region; and cutting off a part of the non-display unit region other than the plurality of connecting lines by an etching process or a laser cutting process.

19. The method according to claim 15, wherein the aligning and assembling the plurality of substrates spaced apart from each other and the plurality of display units spaced apart from each other in a one-to-one correspondence manner by a transferring process comprises adhering the plurality of substrates to the plurality of display units in a one-to-one correspondence manner.

* * * * *